United States Patent
Tow

(10) Patent No.: US 6,560,839 B1
(45) Date of Patent: May 13, 2003

(54) METHOD FOR USING A MOISTURE-PROTECTIVE CONTAINER

(75) Inventor: Poh-Siew Tow, Sunnyvale, CA (US)

(73) Assignee: Integrated Device Technology, Inc., Santa Clara, CA (US)

(*) Notice: Subject to any disclaimer, the term of this patent is extended or adjusted under 35 U.S.C. 154(b) by 0 days.

(21) Appl. No.: 08/847,898

(22) Filed: Apr. 28, 1997

(51) Int. Cl.⁷ .............................. B23Q 17/00
(52) U.S. Cl. .................. 29/407.01; 53/139.2; 53/50; 53/402; 53/401; 426/106; 426/392; 426/383; 426/331; 206/328
(58) Field of Search .................. 53/139.2, 50, 402, 53/401; 426/106, 392, 383, 331; 29/407.01; 206/328

(56) References Cited

U.S. PATENT DOCUMENTS

| | | | |
|---|---|---|---|
| 4,154,344 A | | 5/1979 | Yenni, Jr. et al. |
| 4,424,900 A | | 1/1984 | Petcavich |
| 4,463,851 A | | 8/1984 | Cecil |
| 4,496,406 A | | 1/1985 | Dedow |
| 4,756,414 A | | 7/1988 | Mott |
| 4,807,425 A | * | 2/1989 | Abrams .................. 53/50 |
| 4,906,494 A | | 3/1990 | Babinec et al. |
| 5,095,626 A | | 3/1992 | Kitamura et al. |
| 5,107,989 A | | 4/1992 | Becker |
| 5,274,914 A | | 1/1994 | Kitamura et al. |
| 5,295,297 A | | 3/1994 | Kitamura et al. |
| 5,314,732 A | | 5/1994 | Wiste |
| 5,318,181 A | | 6/1994 | Stover et al. |
| 5,448,165 A | | 9/1995 | Hodge et al. |
| 5,469,692 A | * | 11/1995 | Xanthopoulos ............ 53/50 |
| 5,478,618 A | | 12/1995 | Rosé |
| 5,528,157 A | | 6/1996 | Newberry et al. |
| 5,551,557 A | | 9/1996 | Brooks et al. |
| 5,804,265 A | * | 9/1998 | Saad et al. .............. 428/35.2 |

FOREIGN PATENT DOCUMENTS

| | | | | |
|---|---|---|---|---|
| AU | B-20406/92 | * | 11/1993 | ............ 53/139.2 |
| FR | 1163421 | * | 9/1958 | ............ 53/139.2 |
| GB | 2073130 A | * | 3/1981 | ............ 53/139.2 |

OTHER PUBLICATIONS

EIA/JEDEC Publication, Guidelines for the Packing, Handling and Repacking of Moisture–Sensitive Components, EIA/JEP124, Dec. 1995, Electronics Industries Assoc., Engineering Dept (of 12 pp.).

JEDECc Standard, Test Method A112, Moisture–Induced Stress Sensitivity for Plastic Surface Mount Devices, JESD22–A112, Apr. 1994, Electronic Industries Assoc., Engineering Dept (of 9 pp.).

* cited by examiner

Primary Examiner—Irene Cuda-Rosenbaum
(74) Attorney, Agent, or Firm—Isabelle R. McAndrews

(57) ABSTRACT

A method for using a moisture-protective container to protect an integrated circuit is disclosed herein. The integrated circuit is placed into a container having a first surface and a second surface that is opposite the first surface, and then the container is closed with a seal. Next, the seal is broken to remove the integrated circuit for evaluation. After evaluation without subjecting the integrated circuit to burn-in, the integrated circuit is restored to the container and the container is resealed with the seal. Lastly, the seal of the container is broken to connect the integrated circuit to a substrate without elevating the temperature surrounding the integrated circuit above the temperature at which evaluation occurred.

33 Claims, 4 Drawing Sheets

METHOD FOR USING A MOISTURE-PROTECTIVE CONTAINER

BACKGROUND OF THE INVENTION

1. Field of the Invention

This invention relates to protecting moisture-sensitive components from moisture. In particular, the invention is directed to a method for protecting integrated circuits from moisture accumulated during back-end testing.

2. Background

After the traditional burn-in testing of electronic components, various testing steps are performed under ambient conditions. The conventional sequence of steps used in the back-end processing of an integrated circuit is shown in FIG. 1. Throughout back-end testing, and especially during the intervals between each test, the integrated circuits are exposed to moisture. To provide customers with components having a maximum floor life, it is conventional to bake components prior to shipment. The baking step removes any moisture introduced during back-end testing, thereby producing dry components. It is important to remove all moisture lingering on plastic encapsulated IC packages, as otherwise excess moisture can induce package cracking upon mounting a package onto a board. The aforementioned baking step is typically performed at 125° C. between 16 and 24 hours. To ensure that customers will be given adequate time (typically 168 hours) to use the ICs after removal from their container, a need exists for modifying the conventional back-end processing of moisture sensitive components.

SUMMARY OF THE INVENTION

The present invention provides a method to protect moisture-sensitive components from undesirably high moisture exposure during back-end testing after burn-in. Burn-in comprises elevating the ambient temperature surrounding a semiconductor package while an electrical load is applied to the die.

Moisture-sensitive components that may be protected in accordance with the present invention include plastic encapsulated integrated circuits, and other goods that are at risk of being damaged by undue exposure to moisture.

The method of the invention encompasses protecting a moisture sensitive component from exposure to moisture above a predetermined threshold level. A moisture sensitive component is placed into a container with desiccant and then sealed. Once, the moisture sensitive components are to be evaluated, the container is unsealed and the components removed from their container. After evaluation, the components are restored to the container, which is then resealed. The above steps are repeated until the components are placed into their container for either shipment, or transportation outside the local testing environment. The protective container is any type of enclosure that minimizes the exposure of moisture-sensitive components to the ambient environment. Due to the effectiveness in stemming moisture accumulation, a balding step is not necessary immediately prior to shipment.

DETAILED DESCRIPTION OF INVENTION

The time from immediately after burn-in to just before placing a moisture-sensitive component in a shipment container is referred to herein as back-end testing. The term "completed IC" refers to a packaged die. In volume manufacturing, certain completed ICs undergo delayed evaluation at various times during back-end testing due to interruptions or because other lots are being tested. Completed ICs waiting to be tested are in a staging period. During the staging period, more and more moisture is being absorbed by completed ICs. The total moisture absorbed during staging periods requires moisture-sensitive devices to be baked immediately prior to board assembly, or connection onto a substrate, to reduce the detrimental effects of moisture.

Figure 1:
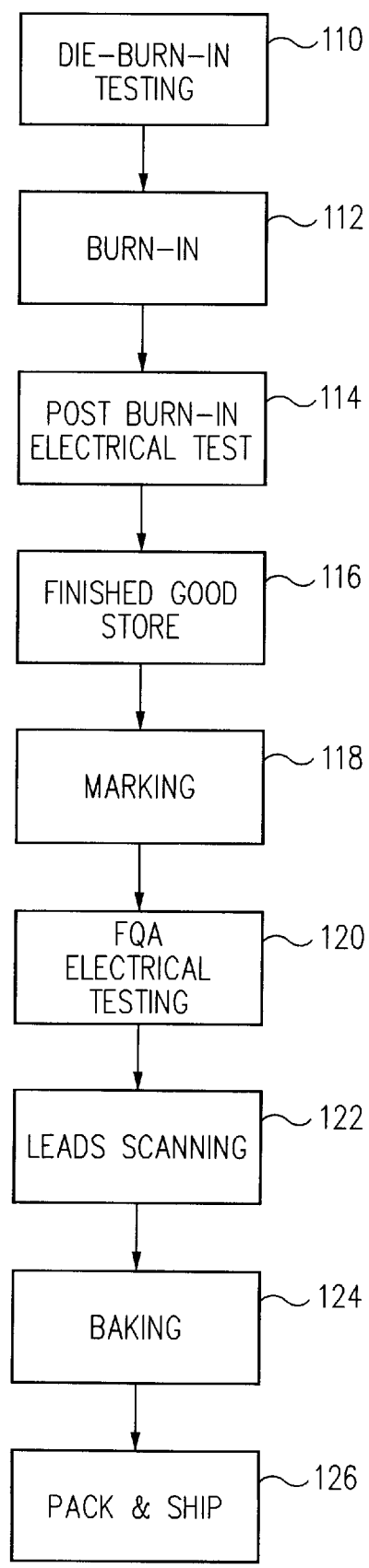
FIG. 1 is a flowchart of manufacturing steps performed in a back-end testing process.

This invention eliminates the need for a baking step immediately before such assembly or connection by preventing substantial amounts of moisture from being introduced into the IC after burn-in. The invention encompasses storing completed ICs during all staging periods in a sealable container that is substantially impervious to moisture. For convenience, such a container is referred to herein as a "protective container". The ICs are restored to a protective container whenever their evaluation is complete. In a preferred embodiment, the protective container is a moisture-barrier bag that contains desiccant. After burn-in step 114, shown in FIG. 1, the moisture-sensitive components are enclosed in a protective container. Once back-end testing is about to begin, the ICs are removed from the moisture-barrier bag and tested. For example, completed ICs temporarily stored in a moisture-barrier bag are removed when ready to be electrically tested, and then restored to their moisture-barrier bag until the next step in back-end testing is about to start. When completed ICs are to be evaluated again e.g., for coplanarity of leads, the ICs are removed again from their container and tested. By enclosing ICs in moisture-barrier bags during all staging periods after burn-in, the conventional baking step 124 is eliminated.

Figure 2A:
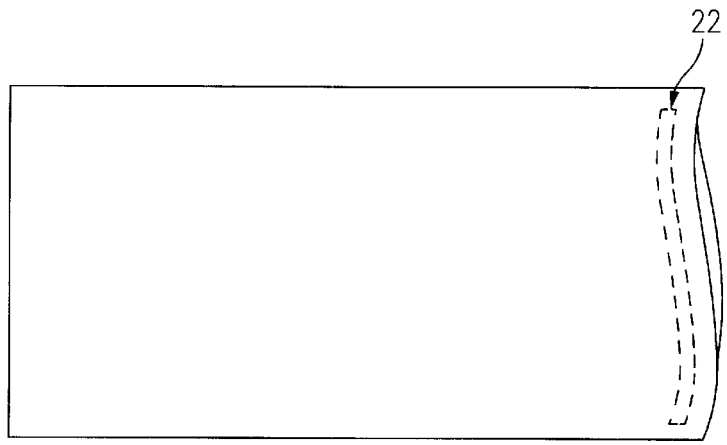
FIGS. 2A–2C illustrate various different mating regions for closing the container that is used in accordance with the method of the invention.

In a preferred embodiment, the protective container will have a mating region 22 on each interior surface, near its opening as shown in FIG. 2A The mating regions may constitute Velcro®; adhesive material; mechanical fasteners, including zippers, clips; or anything else known to create an enclosure. The protective container becomes temporarily sealed upon applying pressure, heat, thermo-compression, or a vacuum to the mating regions.

Figure 2B:
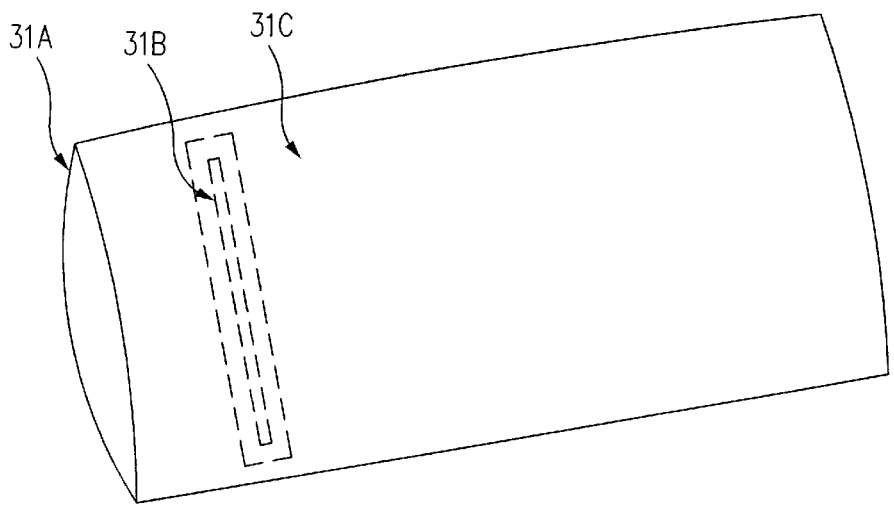
Figure 2C:
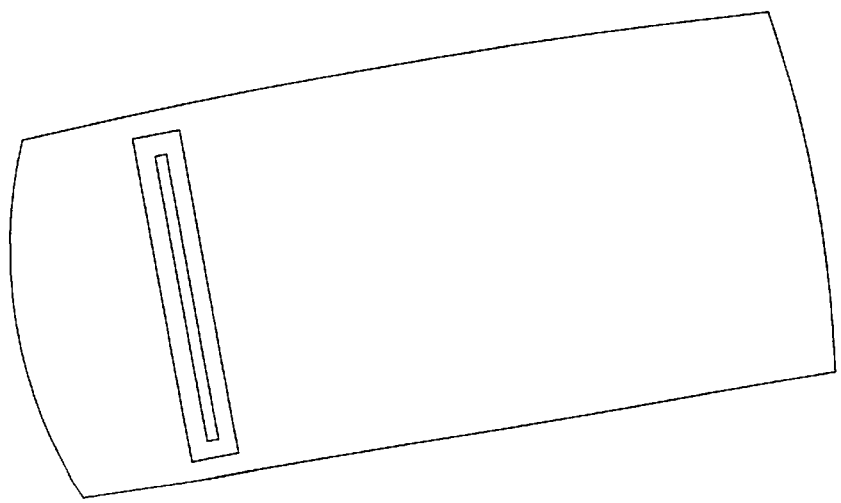

In an alternate embodiment of the invention the protective container can be a bag, envelope or pouch that has at least two mating regions 31A and 31B as shown in FIGS. 2B and 2C. FIG. 2B illustrates a container that is similar to the moisture-barrier bag of FIG. 2A, with a second mating region 31B approximately three or more inches apart from the first mating region 31A. Alternatively, the first mating region 31A may comprise the top opening, or first mating region 31A, can be sealed via heat, vacuum or pressurization or via any other equivalent manner. The second mating region is a temporary seal much like the first mating region previously described. The purpose of the second mating region is to allow customers to evaluate a moisture-sensitive component and then restore the component to the protective container if its use in a system or board will be delayed. It is also possible to have a thermally sealable mating region below 31B as shown in FIG. 2B in the area indicated by 31C.

For integrated circuits, the moisture exposure limit in a given humidity environment varies depending on the size and thickness of the packaged component. Typically, for the plastic Thin Quad Flat Pack package (TQFP), the moisture threshold limit is 0.12%. Based on experiments conducted in exposing TQFP packages in a 30° C./60% relative humidity environment, the moisture level of 0.12% was exceeded after approximately 20 days of exposure. Thus, after 20 days' exposure to an ambient environment, the risk of a TQFP cracking at board assembly rises to greater than a 90% probability. If moisture exposure from the back-end processing can be limited to approximately 10 days maximum, baking step 124, shown in FIG. 1, can be avoided, and the TQFP can still meet 7 days floor life after removal from the protective container.

The moisture-barrier bag in which the completed ICs are placed should contain a desiccant, such as for example, silica gel. The bag may be a moisture barrier bag from Richmond Technology (Drypac<®>) or from Baystat (e.g., StratoGuard™ 9626 or StratoGuard™ 9860), provided that such bags are modified in accordance with the present invention. Nevertheless, any container composed of a layer of conductive material, an organic polymer layer such as polyester or polyethylene, an antistatic material, and a heat-dissipative coating on the interior would be suitable for practicing the present invention.

Figure 3:
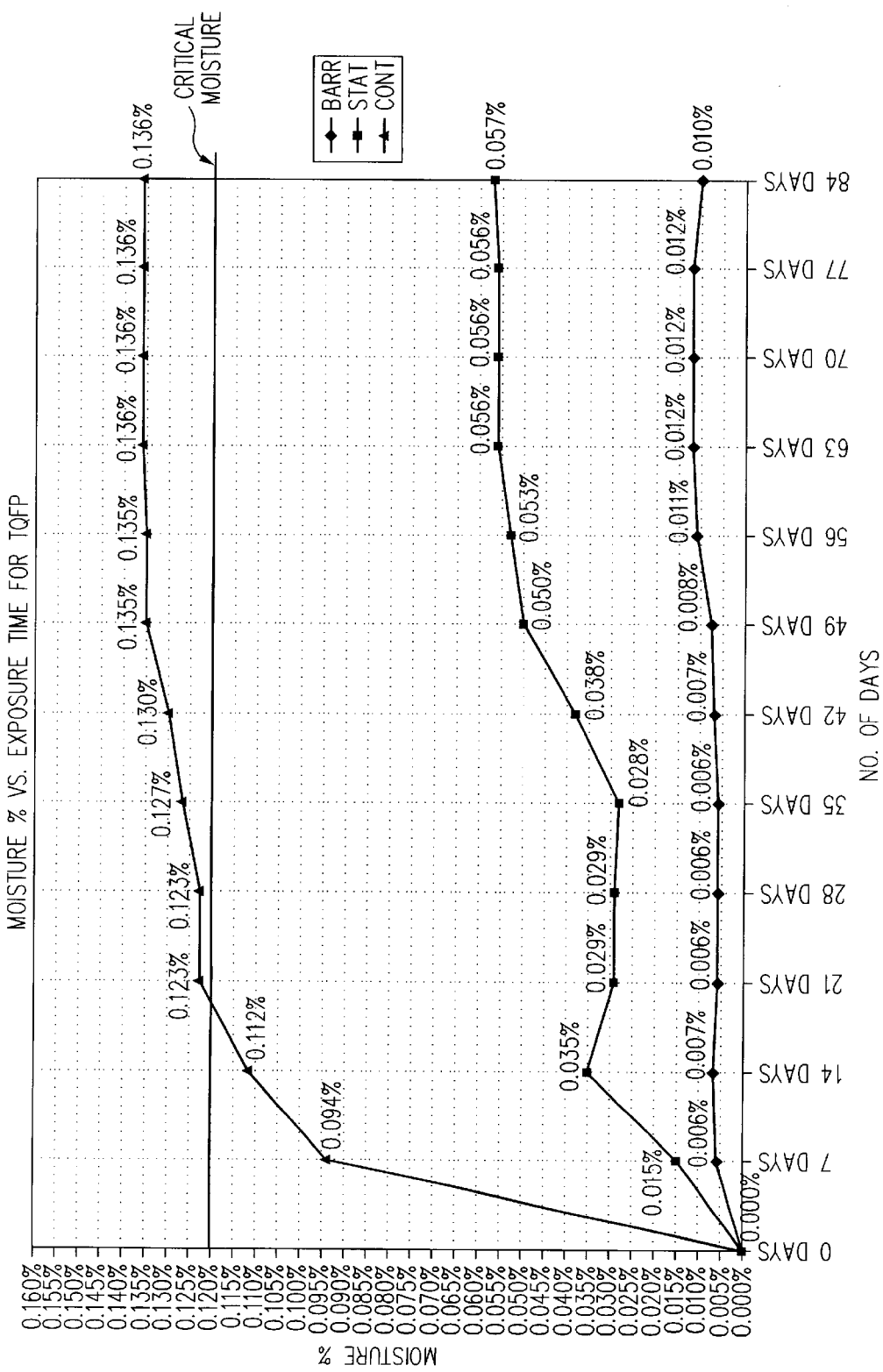
FIG. 3 is a graph of Moisture Percent versus Exposure Time for thin quad flat packages.

FIG. 3 illustrates the results of applying the invention to a thin quad flat package. A TQFP control sample was exposed to 30° C./60% relative humidity environment over 84 days without the use of any type of protective container. TQFP test samples that were placed in an opaque moisture-barrier bag, containing desiccant, did not accumulate more than 0.012% moisture over an 84-day period.

For the TQFP (thin Quad Flat Pack) evaluated, the critical point at which cracking occurred was at the 0.12% moisture level. From FIG. 3, 0.12% moisture would be absorbed by the control after just 20 days of exposure to a 30°/60% relative humidity environment. From FIG. 3, the maximum moisture percent accumulated by TQFP stored in a moisture barrier bag, such as the Drypac<®> bag (the BARR bag), over 84 days, aggregated to the amount of moisture percent accumulated when exposed to the atmosphere over a ten-day period was less than the critical level of 0.12%. This may be expressed mathematically as follows:

(0.010)[(% moisture of TQFP in Barrier bag)]+0.105%[(% moisture of control after 10 days)]<0.12

The invention thus provides a process that allows "protected exposure" for lengthy periods of time, combined with unprotected exposure, without the resulting moisture levels exceeding the predetermined threshold, or approximately 0.12% in the case of TQFP semiconductors.

FIG. 3 also illustrates the % moisture absorption of TQFP samples enclosed within a more highly vapor transmissive bag (using a STAT bag). Use of an electrostatic sealing bag (such as a STAT bag) to implement the method of the invention is not as effective as the moisture barrier bag. Nevertheless, the maximum exposure time for the samples in the STAT bag is just under 35 days—a period longer than the exposure time allowable in the conventional process that requires a baking step.

The advantages of the present invention can be readily appreciated by comparing the different results obtained when a protective container is used during staging, and when the protective container is not used during staging periods.

Thus, the novel process of this invention provides an enormous amount of latitude to both the manufacturer and the customer in that the moisture percent absorbed during evaluation is maintained within an acceptable level over an extended period. As a result, the process of this invention will obviate the need for baking step 124, shown in FIG. 1.

A wide variety of different types of evaluation were performed to simulate back-end testing using a protective container to protect semiconductor packages during staging periods. The amount of moisture accumulated by the samples was measured before and after each test operation by weighing the samples using the chemical balance at room temperature. In general, the weight gain will equal the percent moisture accumulated by a device.

Figure 4:
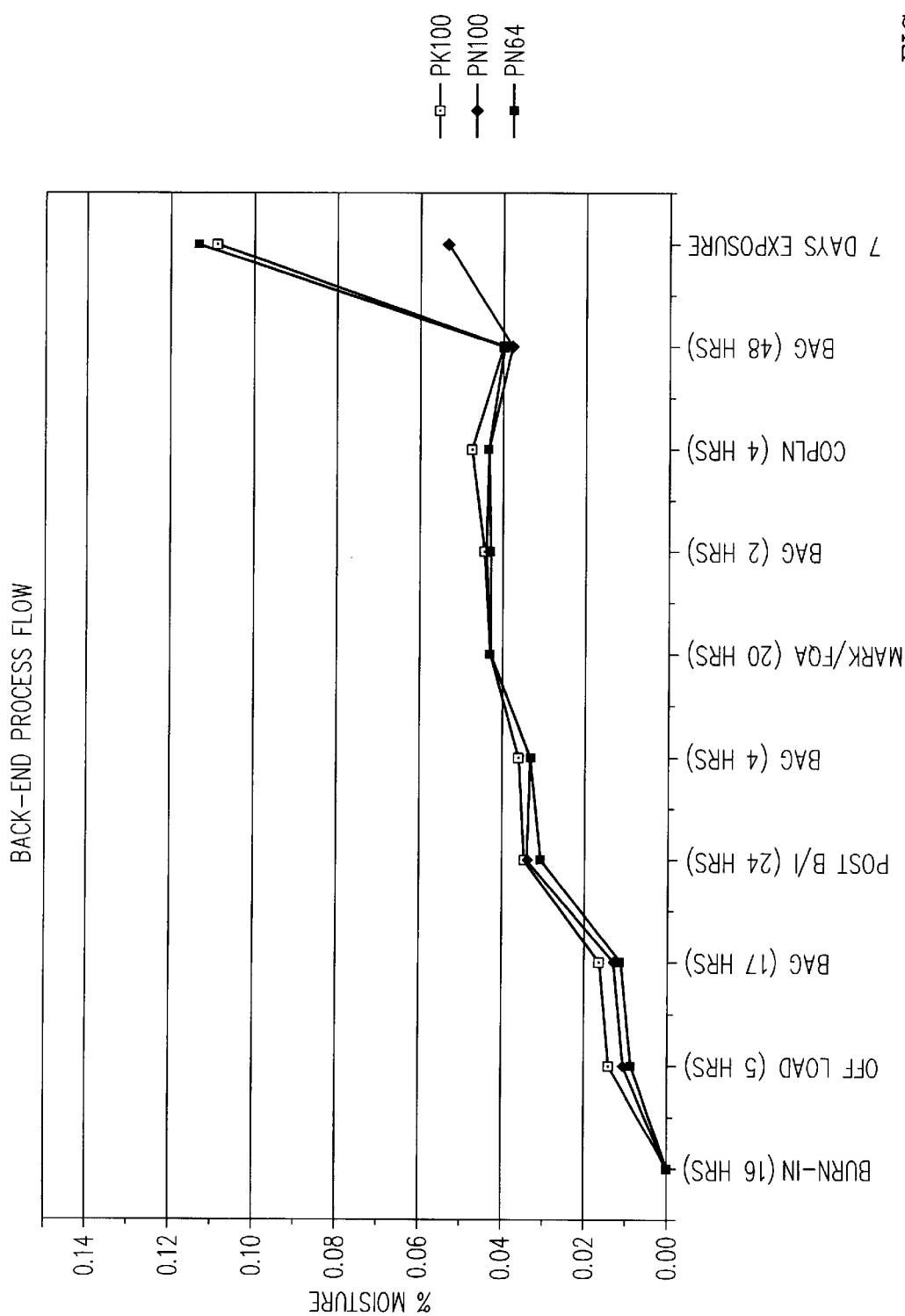
FIG. 4 illustrates moisture accumulation at different points during a back-end flow process.

FIG. 4 represents moisture accumulation throughout back-end testing at various degrees of exposure, including 7 days floor life to simulate a typical floor limit given to an end-user. The time indicated adjacent each evaluation represents the maximum anticipated period for performing the indicated evaluation. Thus, for example, delays caused by malfunctioning or verification are taken into account in the time periods shown. The results prove that with the proper control of moisture exposure, the product moisture level can be confined within an acceptable level to avoid baking step 124.

In testing the present invention, seven (7) production lots were processed at the back end using a protective container during all staging periods. The specific packages evaluated and the moisture level present immediately before shipment are shown in Table 1. The percent moisture level of each package evaluated was low enough to eliminate baking step 124.

TABLE 1

MOISTURE DATA RESULTS

| PACKAGE TYPE | DIMENSIONS (mm) | % MOISTURE LEVEL |
|---|---|---|
| TQFP 64 PINS | 14 × 14 × 1.4 | 0.012 |
| TQFP 64 PINS | 14 × 14 × 1.4 | 0.027 |
| TQFP 64 PINS | 14 × 14 × 1.4 | 0.036 |
| TQFP 64 PINS | 14 × 14 × 1.4 | 0.022 |
| TQFP 100 PINS | 14 × 20 × 1.4 | 0.038 |
| TQFP 100 PINS | 14 × 20 × 1.4 | 0.031 |
| TQFP 100 PINS | 14 × 20 × 1.4 | 0.023 |

Based on the examples provided above, the skilled artisan can readily apply the invention to other types of moisture-sensitive components, such as other types of moisture-sensitive integrated circuits. Of course, the parameters for implementing the invention will vary based on the environment; vapor transmission rate of the container; container contents; and specific moisture-sensitive component to be protected. To apply the invention to all ICs, it is necessary to define the critical moisture threshold that would shorten the useful life of the package under analysis, or cause cracking, to occur based on the % relative humidity and temperature of the environment that the packages will be exposed to. Such a critical moisture level can be determined by preparing a moisture absorption curve using the guidelines of JEDEC standard JESD22-A112.

Weight gain analysis (absorption) can be very valuable in determining estimated floor life (the time from removal of a device from dry pack until it absorbs sufficient moisture to be at risk during reflow soldering). Weight gain/loss is calculated using an average gain/loss for the entire sample. JEDEC standard JESD22-A112 recommends that ten (10) devices be used in the sample so that the average weight can be calculated by simply moving the decimal.

The following formulas and definitions are useful for weight gain analysis:

Final weight gain=(wet weight−dry weight)/dry weight.

Interim weight gain=(present weight−dry weight)/dry weight.

"Wet" is relative and means the package is saturated with moisture under specific temperature and humidity conditions such as 85° C./85% RH or 85° C./60% RH "Dry" is specific and means no additional moisture can be removed from the package at 125° C.

In accordance with the JEDEC standard, the dry weight of the sample should be determined first. Bake the sample for 48 hours minimum at 125+5/0° C. to ensure that the devices are dry. Within one (1) hour after removal from the oven, weigh the devices using a chemical balance to determine an average dry weight. For smaller SMDs (less than 1.5 mm total height), devices should be weighed within thirty (30) minutes after removal from oven.

Within one (1) hour after weighing, place the devices in a clean, dry, shallow container so that the parts do not touch each other and then place the devices in the desired non-biased temperature/humidity condition for the desired length of time.

The devices are removed from the temperature/humidity chamber and allowed to dry for a minimum of fifteen (15) minutes. Within one (1) hour after removal from the oven, weigh the devices. For small SMDs (less than 1.5 mm total height), devices should be weighed within thirty (30) minutes after removal from oven. After the devices are weighed, the devices are reinserted into the temperature/humidity chamber as set forth above. No more than two (2) hours total time should elapse between removal of devices from the temperature/humidity chamber and their return to the chamber.

The devices are then re-weighed, returned to desired temperature/humidity chamber for the predetermined time, removed from the chamber and weighed again until saturation is reached. The saturation point is reached when no additional increase in moisture absorption is found.

The six (6) moisture sensitivity levels of JEDEC standard 022-A112 (JEDEC standard) are set forth in Table 2. The recommended procedure is to start testing at the lowest moisture sensitivity level the evaluation package is reasonably expected to pass (based on knowledge of other similar evaluation packages). Samples may be run concurrently on one or more moisture sensitivity levels. Testing must be continued until a passing level is found. For each evaluation package consisting of an SMD package type (SOIC-small outline IC, PQFP-plastic quad flat pack, PLCC-plastic leaded chip carrier, etc.), number of pins, mold compound, and die pad area to be evaluated, select a sample of ten (10) units for each moisture sensitivity level to be tested. A minimum of two non-consecutive assembly lots must be included in the sample with each date code having approximately the same representation.

In order to minimize testing, the results from a given SMD package type, mold compound, and die pad area may be accepted to cover all other devices in the same SMD package, same mold compound, and same or smaller die pad area.

A room temperature electrical dc and functional test is performed to verify that the devices meet the room temperature data sheet specification. Then a visual examination under 40× magnification of the external package is performed to ensure that devices with cracks or damage (visible at 40×) are omitted from this test method.

The sample is then baked for 24 hours minimum at 125+5/0° C. to render the package dry and hence, moisture free. This time may be modified if desorption data on the particular device under test shows that more or less time is required to obtain a "dry" package when starting in the wet condition for 85° C./85% RH.

Each sample often (10) units must be handled with adequate precautions to ensure that ESD damage does not occur. Devices are placed in a clean, dry container and are positioned so that the parts do not contact each other. Each sample is soaked as shown in Table 2. The devices are then removed from the temperature/humidity chamber and allowed to dry for a minimum of fifteen (15) minutes.

Not sooner than fifteen (15) minutes and not longer than four (4) hours after removal from the temperature/humidity chamber, each sample is subjected to either two cycles of VPR at 215–219° C. for 60 seconds, or two cycles of IR at 215–220° C. (top side package body) for 60 seconds. The devices must be allowed to cool down for five (5) minutes minimum between VPR or IR cycles. The devices are then inspected under a microscope (40×) for external cracks. Electrical room temperature dc and functional tests are then performed on all devices. Subsequently, a "polished" cross section analysis or a scanning acoustic microscope is used to evaluate all devices. If a scanning acoustic microscope is used, all of the reject criteria set forth in (a)–(d) below are applicable.

For a polished cross section analysis, the devices are sectioned in half with a vertical section through the middle (when viewed from either side or end). The other half of the devices is sectioned with a vertical section through the middle of the package, along opposite corners of the device.

A device under the JEDEC standard is considered a failure if it exhibits any of the following:

(a) external crack visible under 40× optical microscope.

(b) any internal crack that extends more than ⅔ of the distance from crack initiation to bonding fingers or package surface.

(c) electrical room temperature dc or functional failure. If failure analysis can show that the electrical failure is not due to moisture-stress sensitivity (for example, electrical overstress), then that failure may be disallowed. If more than one failure is disallowed, that subgroup must be rerun.

(d) complete delamination on top of die as verified by a scanning acoustic microscope. This criterion only applies if the scanning acoustic microscope is used.

TABLE 2

| | MOISTURE SENSITIVITY LEVELS | | | |
|---|---|---|---|---|
| JEDEC | FLOOR LIFE | | SOAK REQUIREMENTS | |
| LEVEL | CONDITIONS | TIME | TIME | CONDITIONS |
| 1 | ≦30° C./90% RH | Unlimited | 168 Hours | 85°C./85% RH |
| 2 | ≦30° C./60% RH | 1 Year | 168 Hours | 85°C./60% RH |

TABLE 2-continued

MOISTURE SENSITIVITY LEVELS

| JEDEC LEVEL | FLOOR LIFE | | SOAK REQUIREMENTS | | | |
|---|---|---|---|---|---|---|
| | | | TIME (Hours) | | | |
| | CONDITIONS | TIME | X+ | Y | = Z | CONDITIONS |
| 3 | ≦30° C./60% RH | 168 Hours | 24 | 168 | 192 | 30° C./60% RH |
| 4 | ≦30° C./60% RH | 72 Hours | 12 | 72 | 84 | 30° C./60% RH |
| 5 | ≦30° C./60% RH | 24 Hours | 6 | 24 | 30 | 30° C./60% RH |
| 6 | ≦30° C./60% RH | 6 Hours | 0 | 6 | 6 | 30° C./60% RH |

X = Default value of Semiconductor manufacturer's time between bake and bag. If Semiconductor manufacturer's actual time between bake and bag is different from the default value, the actual time must be used.
Y = Floor life of package after it is removed from dry pack bag.
Z = Total soak time for evaluation.

The moisture absorption curve (first curve) illustrates the time it takes for samples to reach their critical moisture level. A similar curve (second curve) can be prepared for samples placed in a protective container during staging in accordance with the invention. The results of the first curve will allow one to assess what the maximum exposure time is before an IC or group of ICs reach the critical moisture level. The second curve indicates the period of time for which the analyzed sample can be sustained within a protective container without experiencing any package failures. Together, the two absorption curves illustrate the time constraints necessary to implement the current process of the invention into a manufacturing process. Where it is neither possible nor desirable to completely eliminate the baking step 124, use of the protective container in accordance with the invention will nevertheless significantly reduce the time required for baking.

The embodiments described above are illustrative only. Numerous modifications and extensions may be provided without departing from the spirit of the invention. The true scope of the invention should be interpreted in accordance with the breadth of the claims set forth below.

What is claimed is:

1. A method for protecting an integrated circuit from exposure to moisture above a predetermined threshold level comprising:
   a) placing said integrated circuit into a container having a first surface and a second surface opposite said first surface;
   b) closing said container with a seal;
   c) breaking said seal to remove said integrated circuit for evaluation;
   d) restoring said integrated circuit to said container after evaluation without subjecting said integrated circuit to bum in;
   e) resealing said container with said seal after restoring said integrated circuit to said container:
   f) breaking said seal to connect said integrated circuit to a substrate without elevating the temperature surrounding said integrated circuit above the temperature at which evaluation occurred prior to connecting said integrated circuit to a substrate.

2. The method of claim 1, wherein step b) is performed by using a permanent seal.

3. The method of claim 1, wherein step b) is performed by using a temporary seal.

4. The method of claim 1, wherein step b) is performed by using a temporary seal and a permanent seal.

5. The method of claim 1, wherein said container comprises a mating region on each of said first surface and said second surface.

6. The method of claim 5, wherein said mating region comprises a rail on one wall and a plurality of slots on the opposing wall.

7. The method of claim 5, wherein said mating region comprises an adhesive region on said first surface and a mating region on said second surface.

8. The method of claim 5, wherein said mating region comprises a fastener for closing said container.

9. The method of claim 5, wherein said mating region comprises Velcro®.

10. The method of claim 1, wherein the temperature surrounding said moisture sensitive component is not elevated prior to shipment above the temperature at which evaluation occurred.

11. The method of claim 1, wherein said container comprises a moisture barrier bag.

12. A method for protecting an integrated circuit from exposure to moisture above a predetermined threshold level comprising:
   a) placing said integrated circuit into a container having a first surface and a second surface opposite said first surface;
   b) closing said container with a seal;
   c) breaking said seal to remove said integrated circuit for evaluation;
   d) restoring said integrated circuit to said container after evaluation; and
   e) resealing said container after evaluation of said integrated circuit is completes
      wherein a baking time for said integrated circuit prior to shipping in a container is shortened or eliminated completely.

13. The method of claim 12, wherein said container includes a desiccant.

14. The method of claim 12, wherein one portion of said container is composed of conductive material.

15. A method for protecting a moisture sensitive component from exposure to moisture above a predetermined threshold level comprising:
   a) placing said moisture sensitive component into a container;
   b) sealing said container with a mating region to keep said component dry;
   c) unsealing said container to remove said moisture sensitive component for evaluation;

d) restoring said moisture -sensitive component to said container after evaluation without subjecting said component to an elevated temperature; and e) sealing said container using said mating region after evaluation of said moisture sensitive component is complete, wherein steps c)–e) are repeated to enable a plurality of tests to be performed on said moisture-sensitive component.

16. The method of claim 15, wherein said container has a conductive portion.

17. The method of claim 15, wherein said container contains a desiccant.

18. The method of claim 15, wherein after sealing said container, said container is stored for an extended period without exposure to moisture above said predetermined threshold level.

19. The method of claim 15, wherein said predetermined moisture threshold comprises 0.12% at a relative humidity of 60% and a temperature of 30° C.

20. The method of claim 15, wherein said container contains a plurality of moisture sensitive components separated from one another.

21. The method of claim 15, wherein after said component is restored, said container is sealed and remains sealed until further evaluation of said moisture sensitive component is desired.

22. The method of claim 15, wherein said evaluation comprises testing, marking, inspecting, observing or processing said moisture sensitive component into a finished package.

23. The method of claim 21, wherein said evaluation comprises testing, marking, inspecting, observing or processing said moisture sensitive component into a finished package.

24. The method of claim 15, wherein said container is a moisture barrier bag.

25. The method of claim 15, wherein said protecting a component from exposure to moisture occurs during back-end testing.

26. The method of claim 15, wherein said container is an electrostatic bag.

27. A method for protecting a packaged die from exposure to moisture above a predetermined threshold level comprising;

a) placing said packaged die into a container;

b) sealing said container with a mating region;

c) unsealing said container to remove said packaged die for evaluation;

d) restoring said packaged die to said container after evaluation without subjecting said packaged die to an elevated temperature; and e) sealing said container using said mating region after evaluation of said packaged die is complete, wherein steps c)–e) are repeated to enable a plurality of tests to be performed on said packaged die.

28. The method of claim 27, wherein said container contains a desiccant.

29. The method of claim 27, wherein after sealing said container, said container is stored for an extended period without exposure to moisture above said predetermined threshold level.

30. The method of claim 27, wherein said predetermined moisture threshold comprises 0.12% at a relative humidity of 60% and a temperature of 30° C.

31. The method of claim 27, wherein said container contains a plurality of packaged die separated from one another.

32. The method of claim 27, wherein said container is a moisture barrier bag.

33. The method of claim 27, wherein said container is an electrostatic bag.

* * * * *